US008008656B2

(12) United States Patent
Nakamura et al.

(10) Patent No.: US 8,008,656 B2
(45) Date of Patent: Aug. 30, 2011

(54) ORGANIC LIGHT-EMITTING TRANSISTOR AND DISPLAY DEVICE

(75) Inventors: Kenji Nakamura, Tsurugashima (JP); Takuya Hata, Tsurugashima (JP); Atsushi Yoshizawa, Tsurugashima (JP); Katsunari Obata, Tokyo (JP); Hiroyuki Endoh, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 308 days.

(21) Appl. No.: 12/439,908

(22) PCT Filed: Aug. 28, 2007

(86) PCT No.: PCT/JP2007/066646
§ 371 (c)(1),
(2), (4) Date: Apr. 21, 2009

(87) PCT Pub. No.: WO2008/029674
PCT Pub. Date: Mar. 13, 2008

(65) Prior Publication Data
US 2009/0315043 A1    Dec. 24, 2009

(30) Foreign Application Priority Data
Sep. 5, 2006 (JP) .................................. 2006-240342

(51) Int. Cl.
*H01L 29/08* (2006.01)
*H01L 35/24* (2006.01)
*H01L 51/00* (2006.01)

(52) U.S. Cl. ............... 257/40; 257/41; 257/60; 257/91; 257/E51.006; 257/E51.026; 313/506; 313/507; 313/508

(58) Field of Classification Search ............... 257/40, 257/347, 51.006, 51.026, 41, 43, 60, 91, 257/103; 313/506–508
See application file for complete search history.

(56) References Cited

U.S. PATENT DOCUMENTS

| | | | | |
|---|---|---|---|---|
| 7,002,176 B2 * | 2/2006 | Iechi et al. | | 257/40 |
| 7,126,153 B2 * | 10/2006 | Iechi et al. | | 257/40 |
| 7,276,728 B2 * | 10/2007 | Iechi et al. | | 257/40 |
| 7,560,735 B2 * | 7/2009 | Furukawa et al. | | 257/72 |
| 7,598,518 B2 * | 10/2009 | Sekiya | | 257/40 |
| 7,633,084 B2 * | 12/2009 | Kido et al. | | 257/40 |
| 7,692,269 B2 * | 4/2010 | Meng et al. | | 257/592 |
| 2002/0167280 A1 | 11/2002 | Hayashi et al. | | |
| 2006/0103290 A1 * | 5/2006 | Suh et al. | | 313/463 |
| 2009/0224233 A1 * | 9/2009 | Obata et al. | | 257/40 |

FOREIGN PATENT DOCUMENTS

JP     2002-343578 A    11/2002
(Continued)

*Primary Examiner* — Zandra Smith
*Assistant Examiner* — Telly D Green
(74) *Attorney, Agent, or Firm* — Sughrue Mion, PLLC

(57) ABSTRACT

An organic light-emitting transistor having a source electrode layer; a drain electrode layer facing the source electrode layer; an organic light-emitting layer formed between the source electrode layer and the drain electrode layer; a semiconductor layer formed between the organic light-emitting layer and the source electrode layer; and a gate electrode layer deposited to face through a gate insulation film to one face of the source electrode layer opposite to the other face facing the drain electrode layer. The organic light-emitting transistor further comprises: a charge-carrier suppression layer formed between the organic light-emitting layer and the source electrode layer to have an aperture; and a relay region formed between the charge-carrier suppression layer and the source electrode layer to relay charge-carriers from the source electrode layer to the aperture.

21 Claims, 11 Drawing Sheets

FOREIGN PATENT DOCUMENTS

| | | |
|---|---|---|
| JP | 2003-282256 A | 10/2003 |
| JP | 2005-243871 A | 9/2005 |
| JP | 2007-109564 A | 4/2007 |
| JP | 2007-149922 A | 6/2007 |
| JP | 2007-200746 A | 8/2007 |
| JP | 2007-200788 A | 8/2007 |

* cited by examiner

VOLTAGE BETWEEN SOURCE AND DRAIN=−10V

ORGANIC LIGHT-EMITTING TRANSISTOR AND DISPLAY DEVICE

TECHNICAL FIELD

The present invention relates to an organic light-emitting transistor and display device that utilizes a compound with charge-carrier transportability (mobility of holes or electrons) and comprises an organic semiconductor layer made of such a compound.

BACKGROUND ART

Currently, there is a focus of attention on light-emitting devices that utilize electroluminescence (called simply "EL" hereinbelow) by the re-coupling of charge-carriers (holes or electrons) in a material, for example, which are emitted upon application of an electric field. For example, EL display devices in which a display panel formed by injection-type organic EL elements that employ organic compound materials is installed have been developed. Organic EL elements include red EL elements that have a structure that emits light of a red color, green EL elements that have a structure that emits light of a green color, and yellow EL elements with a structure that emits light of a yellow color. A color display device can be implemented if these three organic EL elements that emit light in red, blue, and green (RGB) form one pixel light-emitting unit and a plurality of pixels are disposed in a matrix shape on a panel section. As drive systems for a display panel formed by this color display device, a passive matrix drive type and active matrix drive type are known. In comparison with a passive matrix type EL display device, an active matrix drive type EL display device has the benefit of having low power consumption little crosstalk between pixels and is particularly suited to a large screen display device and high definition display device.

A display panel of an active matrix drive type EL display device has anode supply lines, cathode supply lines, and scanning lines that are charged with horizontal scanning and data lines that are arranged intersecting each of the scanning lines formed in the form of a grating. RGB subpixels are formed at the respective RGB intersections of the scanning lines and signal lines. A scanning line is connected to the gate of the Field Effect Transistor (FET) used for the scanning line selection for each subpixel, a signal line is connected to the drain of the FET, and the gate of the FET used for light emission driving is connected to the source of the FET. A drive voltage is applied via an anode supply line to the source of the light-emission drive FET and the anode terminal of the EL element is connected to the drain. A capacitor is connected between the gate and source of the light-emitting drive FET. Furthermore, a ground potential is applied via the anode supply line to the cathode terminal of the EL element.

For example, there is a prior invention (See Patent Literature 1) as shown in FIG. 1 having a structure of an organic light-emitting transistor. This transistor comprises a light-emitting body which is made of an anode ND and a cathode CA of which a part is installed opposed to each other through a luminous material layer LM on a substrate SB; and an auxiliary electrode XE which is formed on the one face of an insulating layer IL opposite to the other face facing the cathode CA and the luminous material layer LM of the anode ND side. In the organic light-emitting transistor structure, a voltage is applied between the auxiliary electrode XE and the cathode CA so that it may be in the same direction as the direction of the voltage that is applied between the anode ND and the cathode CA. In the case of a multicolored organic EL display that uses such organic light-emitting transistors, there are required both of a selectively changing of the material used for the luminous material layer LM and a voltage control that is adapted to the respective luminous material properties in order to change the brightness.

[Patent Literature 1] Japanese Patent Application Laid Open No. 2002-343578

DISCLOSURE OF THE INVENTION

Problem to be Solved by the Invention

According to the prior invention, since a voltage applied to the auxiliary electrode XE changes an amount of electric current flowing between the anode ND and the cathode CA, a current component which is not dependent on the voltage applied to the auxiliary electrode XE is dominant unless any insulating layer is used between the anode ND and the cathode CA. In such a case, the applied voltage to the auxiliary electrode XE does not achieve the changes of current and luminous. Thus for example it is considered that a second insulating layer is formed to come in contact with the anode ND. However the second insulating layer disturbs an electrical contact between the luminous material layer LM and the anode. In the worst possible pass, even if applying a higher voltage 100V than or more across the anode ND and the cathode CA we have little current flow therebetween enough to cause a visible emission as a problem.

Furthermore a conventional organic light-emitting element as typified by an organic EL element is basically an element that exhibits the characteristics of a diode and the majority of such manufactured organic light-emitting transistors are passive-matrix drive-type organic light-emitting transistors. In passive-matrix driving, a momentarily high brightness is required in order to perform line-sequential driving and it has proven difficult to obtain a high-definition display device because the limit count of the scan lines is limited. In recent years, organic EL displays that employ TFTs that use polysilicon or the like have been studied. However, organic EL displays do not lend themselves to an increased screen size because the process temperature is high and the fabrication costs per unit area increase. Further, there have been problems, i.e. while, on the one hand, the aperture drops because two or more transistors and one or more condensers must be arranged in one pixel in order to actively drive the organic EL by using TFTs, the organic EL elements must be made to emit light at a high brightness while performing voltage control that is suited to the respective light-emitting material characteristics.

An example of the problem to be solved by the present invention is that of providing a display device and organic light-emitting transistor capable of increasing the light-emitting efficiency of the organic EL element while performing voltage control that is suited to the respective light-emitting material characteristics.

Means for Solving the Problem

An organic light-emitting transistor according to the invention having a source electrode layer; a drain electrode layer facing said source electrode layer; an organic light-emitting layer formed between said source electrode layer and said drain electrode layer; a semiconductor layer formed between said organic light-emitting layer and said source electrode layer; and a gate electrode layer deposited to face through a gate insulation film to one face of said source electrode layer opposite to the other face facing said drain electrode layer, said organic light-emitting transistor further comprising:

a charge-carrier suppression layer formed between said organic light-emitting layer and said source electrode layer to have an aperture; and a relay region formed between said charge-carrier suppression layer and said source electrode layer to relay charge-carriers from said source electrode layer to said apertures.

In the foregoing organic light-emitting transistor, while the source electrode layer is kept out of contact with the charge-carrier suppression layer, the source electrode layer and the charge-carrier suppression layer are layered inserting the relay region of the semiconductor layer. The organic light-emitting transistor has a separation of the source electrode layer and the charge-carrier suppression layer to secure a good electric connection between the source good electrode layer and the semiconductor layer while facilitating reduction of OFF current.

A display device according to the invention in which a plurality of light-emitting sections are disposed in a matrix shape, each light-emitting section being said organic light-emitting transistor, the display device comprising at least one switching element electrically connected to said gate electrode layer per said organic light-emitting transistor.

The display device comprising organic light-emitting transistors requires fabricating at least one switching element such as afield effect transistor in manufacturing thereof, whereas a protecting film can be formed at the same time with the formation of the charge-carrier suppression layer in order that the switching element is not affected by influence of moisture, activated gas or the like.

BRIEF DESCRIPTION OF THE DRAWINGS

FIG. 13 is a cross-sectional view taken along the line AA' of FIG. 12;

FIG. 14 is an equivalence circuit diagram showing a subpixel light emission section in a display device of another embodiment according to the present invention;

Figure 1:
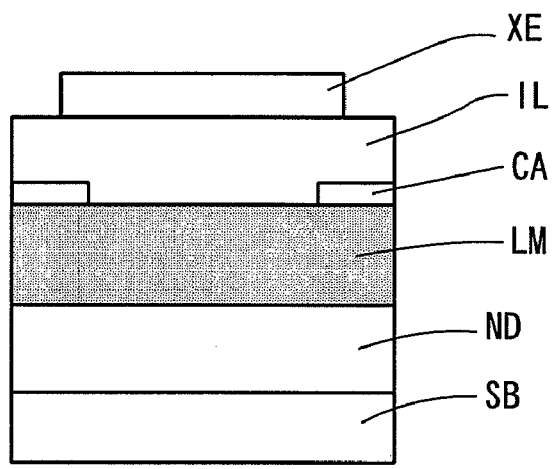
FIG. 1 is a partial cross-sectional view showing a conventional organic light-emitting transistor.

EXPLANATION OF REFERENCE NUMERALS 1 substrate
2 gate electrode layer
3 gate insulation film
4 source electrode layer
5 semiconductor layer
6 organic light-emitting layer
RL relay region
7 drain electrode layer
HTL hole transport layer
EIL electron transport layer
113 capacitor
114 organic light-emitting transistor
BF charge-carrier suppression layer
DL signal line
SL scan lines
VccL supply line
f1,f2 apertures

MODE FOR CARRYING OUT THE INVENTION

The examples of organic light-emitting transistors according to the present invention will be described hereinbelow with reference to the drawings.

Embodiment 1

Figure 2:
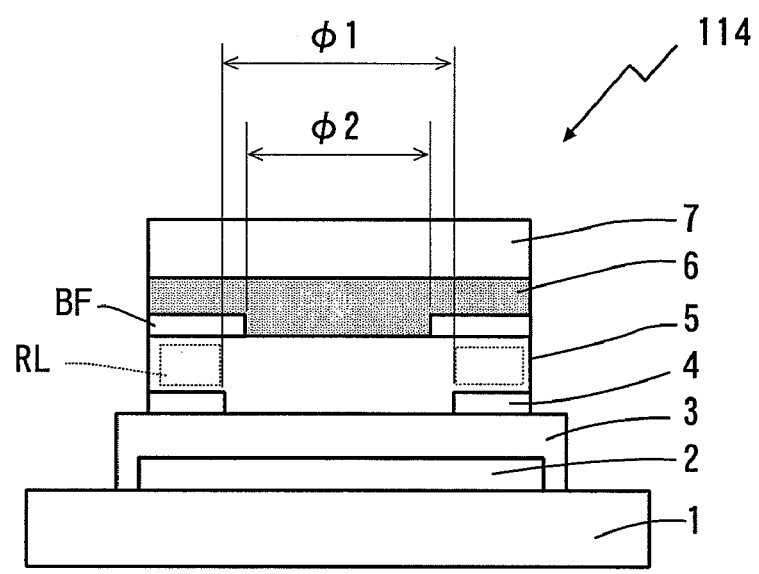
FIG. 2 is a partial cross-sectional view showing an organic light-emitting transistor of an embodiment according to the present invention.

FIG. 2 shows a single organic light-emitting transistor 114 of organic light-emitting transistors formed on a substrate 1 that comprises a organic light-emitting layer 6 that is deposited between a pair of electrodes facing each other (source electrode layer 4 and drain electrode layer 7) as an embodiment according to the present invention.

The organic light-emitting transistor 114 is obtained by forming on a substrate 1, in order, a gate electrode layer 2, an gate insulation film 3, a source electrode layer 4 (anode) having a first aperture f1, a semiconductor layer 5, a charge-carrier suppression layer BF having a first aperture f2, a organic light-emitting layer 6, and a drain electrode layer 7 (cathode). In other words, the organic light-emitting transistor comprises the organic light-emitting layer 6 deposited between the source electrode layer 4 and the drain electrode layer 7 facing parallel each other; the semiconductor layer 5 formed between the organic light-emitting layer 6 and the source electrode layer 4; and the gate electrode layer 2 which is deposited to face through the gate insulation film 3 to one face of the source electrode layer 4 opposite to the other face facing the drain electrode layer 7. In the organic light-emitting transistor, the charge-carrier suppression layer BF is formed between the source electrode layer 4 and the drain electrode layer 7 with the semiconductor layer 5 to cover the source electrode layer 4 so that an area of the charge-carrier suppression layer BF occupying in the transistor is equal to or larger than that of the source electrode layer 4. A portion (edge) of charge-carrier suppression layer BF defining the second aperture f2 is formed to cover the edge defining the first aperture f1 of the source electrode layer 4. The charge-carrier suppression layer BF has the second aperture f2 through which charge-carriers are supplied to the organic light-emitting layer 6, whereas the second aperture f2 has an area smaller than the first aperture f1 of the source electrode layer 4.

The source electrode layer 4 and the charge-carrier suppression layer BF are formed in a pattern that has a grating shape, a comb shape or a blind shape to overlap each other. Thus, the conditions are favorable for electric lines of force caused by the gate electrode layer 2 to pass through the organic semiconductor layer 5. The first aperture f1 of the source electrode layer 4 and the second aperture f2 of charge-carrier suppression layer BF are limited by a closed line edge, these apertures may be formed in comb or blind shape edges of the layers sandwiching the apertures.

In addition, the gate electrode layer 2, the gate insulation film 3 and the source electrode layer 4 are connected electric power supplies respectively. Further, at least one switching element is electrically connected to the gate electrode layer per a light-emitting section in the organic light-emitting transistor. The organic light-emitting transistor includes a wiring that supplies electrical power to a pair of electrodes and a wiring for applying ON/OFF voltage information to the switching element.

The charge-carrier suppression layer BF may be made of an insulating material usable for the gate insulation film 3. In addition to the insulating material, the charge-carrier suppression layer BF may be made of a semiconductor material having a reversed polarity against the semiconductor layer 5. A different semiconductor material in polarity from the semiconductor layer 5 is preferably use for the charge-carrier suppression layer BF (for example, if the semiconductor layer 5 is a p-type material, the charge-carrier suppression layer BF is a n-type material, alternatively, if the semiconductor layer 5 is a n-type material, the charge-carrier suppression layer BF is a p-type material). This is because it is better to have a large energy barrier in order to suppress the movement of charge-carriers. The energy barrier prevents from charge-carriers entering the charge-carrier suppression layer BF. The charge-carrier suppression layer BF is formed so that the second aperture f2 confines a flow of charge-carriers supplied from the source electrode layer 4 to the organic light-emitting layer 6. The charge-carrier suppression layer BF has a thickness equal to or thicker than that of said source electrode layer 4.

The organic light-emitting transistor 114 has the relay region RL formed between the charge-carrier suppression layer BF and the source electrode layer 4 to relay charge-carriers from the source electrode layer 4 to the aperture of the charge-carrier suppression layer BF. The relay region RL is made of the same material as the semiconductor layer 5. In the Embodiment the relay region RL is formed as a portion of the semiconductor layer 5.

In the Embodiment, the charge-carrier suppression layer BF is formed without the expense of electric contact between the source electrode layer 4 and the semiconductor layer 5 (the relay region RL) since there is the relay region RL. Further, on merit of the relay region RL, the area of the charge-carrier suppression layer BF can be set unrestrainedly to be larger than that of the source electrode layer 4, and therefore the leak electric current between source and drain electrodes is reduced drastically. As a result, a lower voltage driving is achieved in comparison with a conventional element and further a large ON/OFF ratio can be acquired.

In the Embodiment, the semiconductor layer 5 (the relay region RL) is formed after forming the source electrode layer 4, therefore, an etching process for the source electrode layer does not influence the semiconductor layer 5.

Embodiment 2

Figure 3:
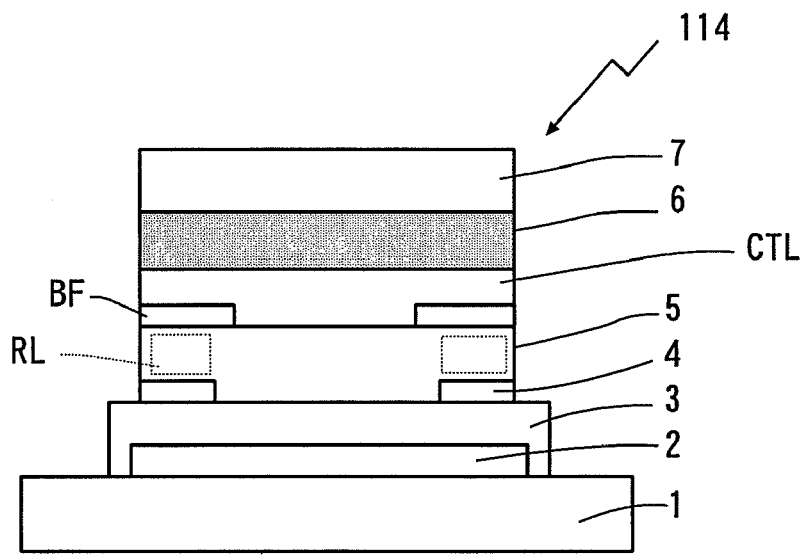
FIGS. 3-11 are partial cross-sectional views each showing an organic light-emitting transistor of another embodiment according to the present invention.

As shown in FIG. 3, the organic light-emitting transistor of Embodiment 2 is the same as the organic light-emitting transistor 114 shown in FIG. 2, except that the carrier transport layer CTL is inserted between the semiconductor layer 5 and organic light-emitting layer 6. The charge-carrier suppression layer BF is deposited at an interface between the semiconductor layer 5 and the carrier transport layer CTL.

Embodiment 3

Figure 4:
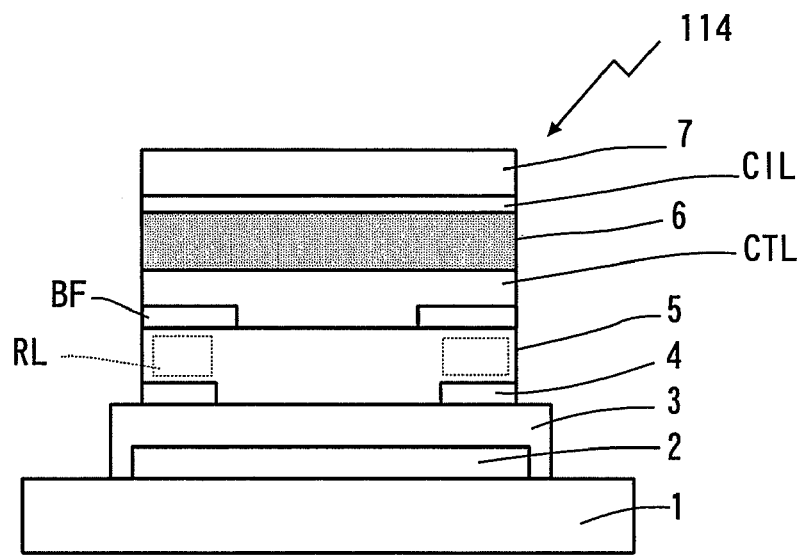

As shown in FIG. 4, the organic light-emitting transistor of Embodiment 3 is the same as the organic light-emitting transistor 114 shown in FIG. 2, except that a carrier transport layer CTL is inserted between the semiconductor layer 5 and the organic light-emitting layer 6 at the same time, a carrier injection layer CIL is inserted between the drain electrode layer 7 and the organic light-emitting layer 6. The charge-carrier suppression layer BF is placed at the interface between the semiconductor layer 5 and the carrier transport layer CTL.

As seen form Embodiments 2 and 3, the carrier injection layer or at least one carrier transport layer or both thereof may be provided between the drain electrode layer 7 and the organic light-emitting layer 6.

An example of the carrier transport layer is a hole transport layer, and an example of the carrier injection layer is a hole injection layer. Materials for these layers include triphenyldiamine derivatives, styrylamine derivatives, amine derivatives containing an aromatic ring, and carbazoyl derivatives and, polymer materials include polyvinylcarbazoyl and derivatives thereof, and polythiophene. Usage of two or more of these compounds may be combined. In addition, generally, the hole transport layer preferably employs an organic semiconductor material with a higher ionization potential Ip than the hole injection layer.

Further, another example of the carrier transport layer is an electron transport layer, and another example of the carrier injection layer is an electron injection layer. Materials for these layers include quinoline derivative such as an organic metal complex in which an 8-quinolinol such as tris(8-quinolinolato) aluminum (Alq3) or the derivative thereof is the ligand, an oxadiazone derivative, a perylene derivative, a pyridene derivative, a pirimidine derivative, a quinoxaline derivative, a diphenylquinone derivative, or a nitro-substituted fluorine derivative or the like can be used as the electron injection layer and/or electron transport layer. The electron injection layer and electron transport layer may be function as the organic light-emitting layer 6 and, in this case, tris (8-quinolinolato) aluminum or the like is preferably used. When the electron injection layer and electron transport layer are stacked and created, the stacking is preferably performed in order with the compound with the largest electron affinity value starting with the drain electrode layer 7.

Embodiment 4

Figure 5:
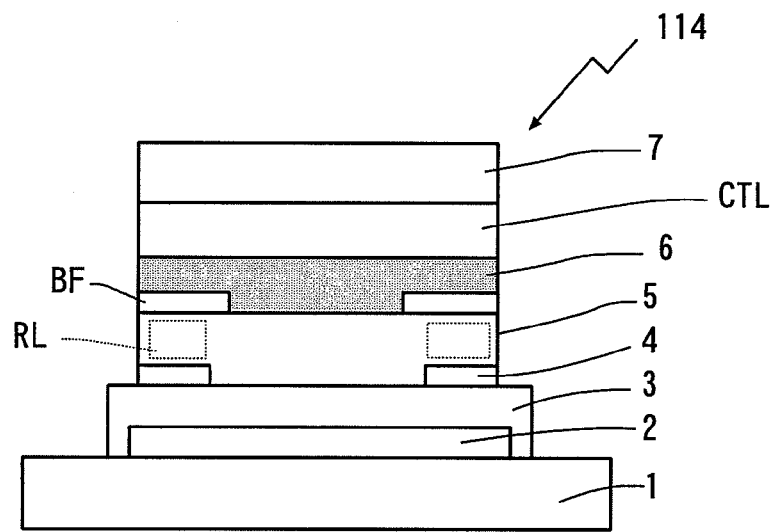

As shown in FIG. 5, the organic light-emitting transistor of Embodiment 4 is the same as the organic light-emitting transistor 114 shown in FIG. 2, except that the carrier transport layer CTL is inserted between the drain electrode layer 7 and the organic light-emitting layer 6. The charge-carrier suppression layer BF is placed at an interface between the semiconductor layer 5 and the organic light-emitting layer 6. In this case, the carrier injection layer CIL may be deposited instead of the carrier transport layer CTL.

Embodiment 5

Figure 6:
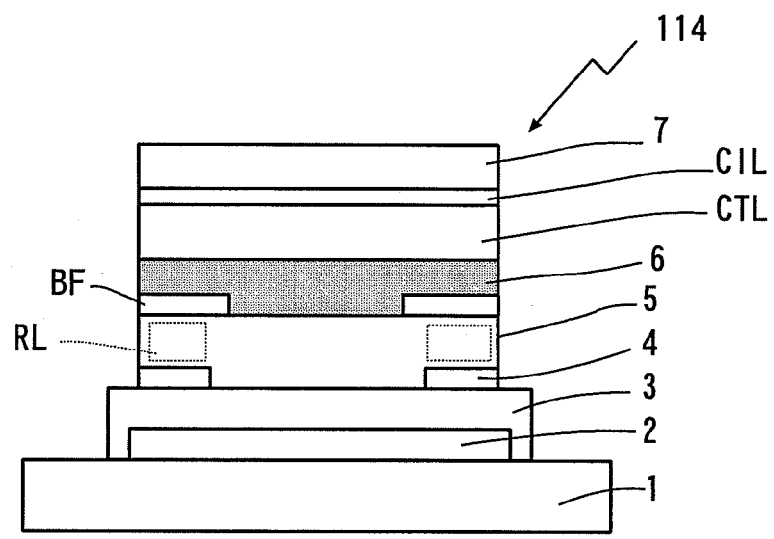

As shown in FIG. 6, the organic light-emitting transistor of Embodiment 5 is the same as the organic light-emitting transistor 114 shown in FIG. 2, except that the carrier injection layer CIL and a carrier transport layer CTL are inserted between the drain electrode layer 7 and the organic light-emitting layer 6. The charge-carrier suppression layer BF is deposited at an interface between the semiconductor layer 5 and the organic light-emitting layer 6.

Embodiment 6

Figure 7:
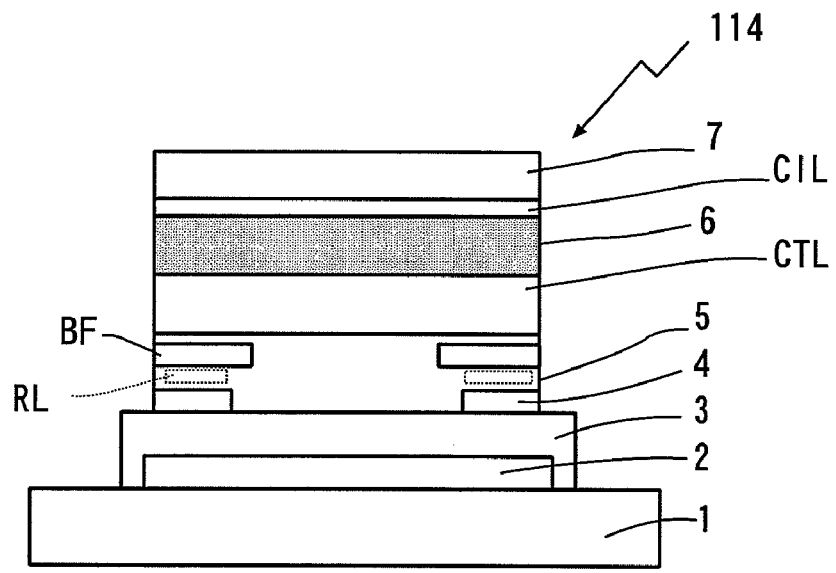

As shown in FIG. 7, the organic light-emitting transistor of Embodiment 6 is the same as the organic light-emitting transistor 114 shown in FIG. 4, except that the charge-carrier suppression layer BF is displaced toward the side of the source electrode layer 4. This Embodiment has the charge-carrier suppression layer BF buried in the semiconductor layer 5 although the charge-carrier suppression layer BF is placed at the interface between the semiconductor layer 5 and the carrier transport layer CTL in the Embodiment 3.

According to such structure, the semiconductor material is not influenced by gas, moisture or the like emitted form the charge-carrier suppression layer BF and, even if other materials are influenced seriously, such influence is reduced by the charge-carrier suppression layer BF wrapped with the semiconductor layer 5.

Embodiment 7

Figure 8:
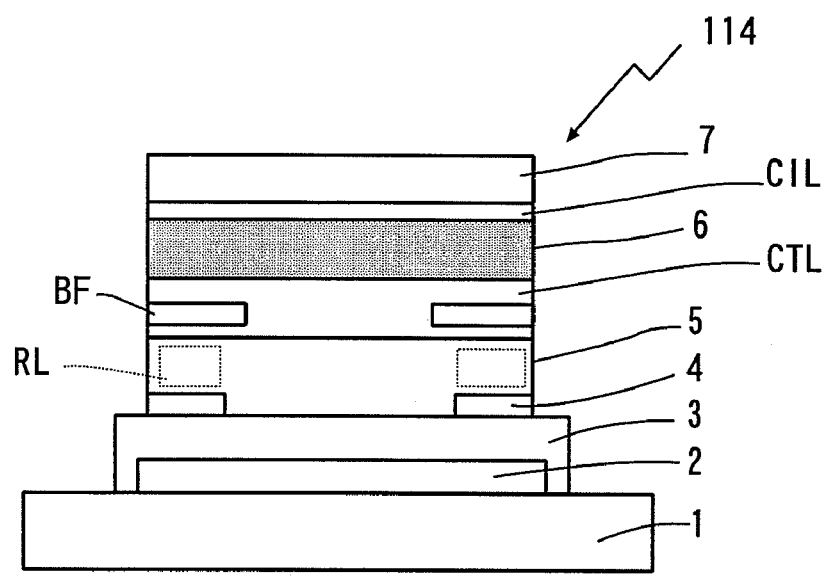

As shown in FIG. 8, the organic light-emitting transistor of Embodiment 7 is the same as the organic light-emitting transistor 114 shown in FIG. 4, except that the charge-carrier suppression layer BF is displaced toward the organic light-emitting layer 6. This Embodiment has the charge-carrier suppression layer BF buried in the carrier transport layer CTL although the charge-carrier suppression layer BF is placed at the interface between the semiconductor layer 5 and the carrier transport layer CTL in the Embodiment 3. A portion of the carrier transport layer CTL (between the semiconductor layer 5 and charge-carrier suppression layer BF) exists and functions as an additional relay region RL.

Embodiment 8

Figure 9:
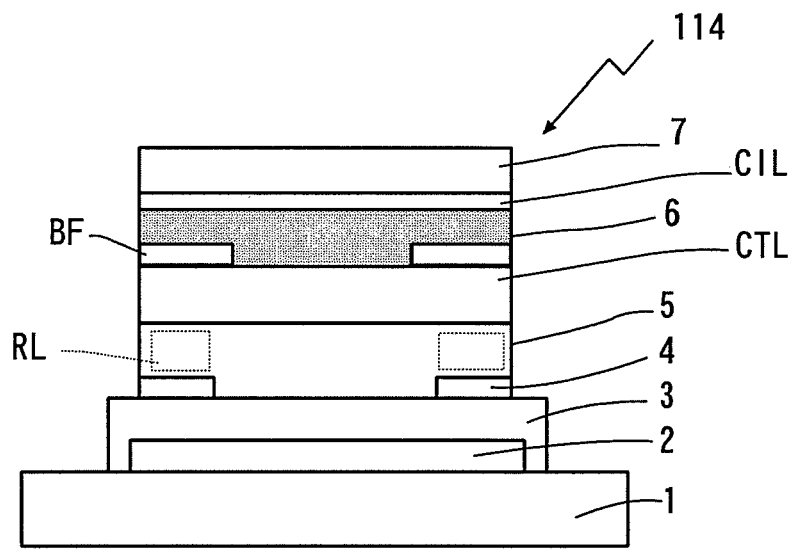

As shown in FIG. 9, the organic light-emitting transistor of Embodiment 8 is the same as the organic light-emitting transistor 114 shown in FIG. 4, except that the charge-carrier suppression layer BF is further displaced into the organic light-emitting layer 6. This Embodiment has the charge-carrier suppression layer BF placed at an interface between the carrier transport layer CTL and the organic light-emitting layer 6, although the charge-carrier suppression layer BF is placed at the interface between the semiconductor layer 5 and the carrier transport layer CTL in the Embodiment 3. A portion of the carrier transport layer CTL (between the semiconductor layer 5 and charge-carrier suppression layer BF) exists and functions as an additional relay region RL.

Embodiment 9

Figure 10:
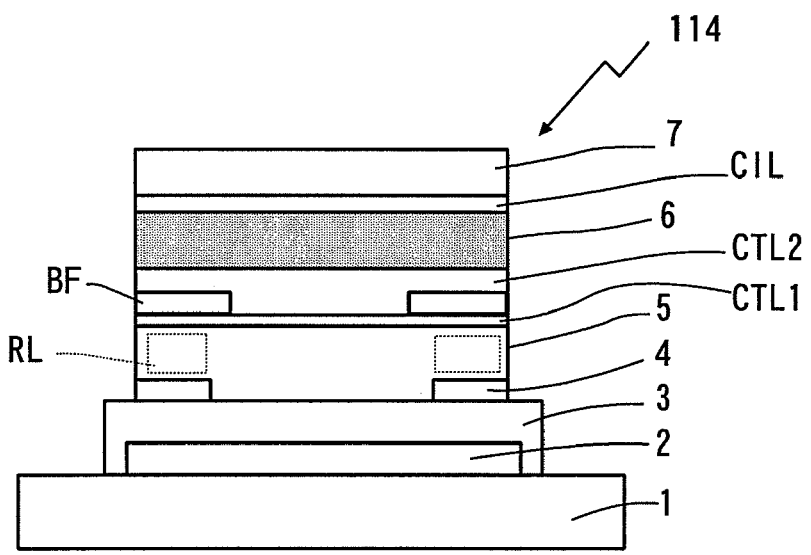

As shown in FIG. 10, the organic light-emitting transistor of Embodiment 9 is the same as the organic light-emitting transistor 114 shown in FIG. 8, except that the first and second carrier transport layers CTL1 and CTL2 are layered instead of the single one and the charge-carrier suppression layer BF is provided at an interface thereof. The carrier transport layer may be formed one or more between the semiconductor layer 5 and the organic light-emitting layer 6. A portion of the carrier transport layer CTL (between the semiconductor layer 5 and charge-carrier suppression layer BF) exists and functions as an additional relay region RL. A portion of the first carrier transport layer CTL1 (between the semiconductor layer 5 and charge-carrier suppression layer BF) exists and functions as an additional relay region RL.

According to Embodiment 8 and 9, in case that the material of the semiconductor layer 5 is very weak against the air exposure (e.g., influenced by an activated gas) as well as the wet processes (e.g., influenced by moisture, an organic solvent, acids, alkalis or the like), a material tough to such influence may be selected and used for the carrier transport layer CTL and then the charge-carrier suppression layer BF is layered thereon to reduce such influence to the semiconductor layer 5.

Embodiment 10

Figure 11:
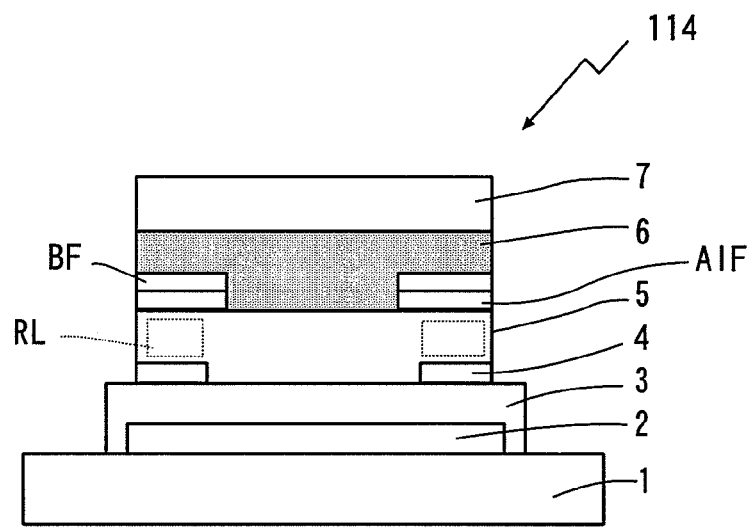

As shown in FIG. 11, the organic light-emitting transistor of Embodiment 10 is the same as the organic light-emitting transistor 114 shown in FIG. 2, except that an additional insulation film AIF having a shape substantially the same as that of the charge-carrier suppression layer BF is formed between the charge-carrier suppression layer BF and the semiconductor layer 5. This structure is to further reduce the leak of electric current between the source electrode layer 2 and the drain electrode layer 7. In this way, there is provided the additional insulation film made of an insulating material covering the charge-carrier suppression layer BF only at a side of the source electrode layer 4 of the charge-carrier suppression layer BF, so that a portion of the organic light-emitting layer 6 can be excluded from between the charge-carrier suppression layer BF and the semiconductor layer 5 to prevent unnecessary light emission. A portion of the additional insulation film (between the semiconductor layer 5 and charge-carrier suppression layer BF) exists and functions as an additional relay region RL.

<Material Examples>

As the material of the substrate 1, there are used a semitransparent or transparent material such as glass, quartz and a plastic material such as polystyrene or the like. Nontransparent materials such as silicon and aluminum or the like, or thermally curable resins such as a phenol resin or the like, or a thermoplastic resin such as polycarbonate or the like can be used for the substrate 1.

The electrode materials of the gate electrode layer 2, source electrode layer 4, and drain electrode layer 7 include metals such as Ti, Al, Li:Al, Cu, Ni, Ag, Mg:Ag, Au, Pt, Pd, Ir, Cr, Mo, W, and Ta or the like or alloys thereof. Alternatively, conductive polymers such as polyaniline or PEDT:PS can be used for the electrode materials. Otherwise, an oxide transparent conductive thin film can be used for the electrode materials whose main component is any of indium tin oxide (ITO), indium zinc oxide (IZO), indium oxide ($In_2O_3$), zinc oxide (ZnO), and tin oxide ($SnO_2$). Furthermore, the thickness of each electrode is preferably on the order of 10 to 500 nm. The electrode material is preferably deposited by vacuum deposition or sputtering. It is preferable for one of the drain electrode layer 7 and the gate electrode layer 2 alternatively both thereof to be selected from the materials having a transmissivity higher than 10% or more in the wavelength of emission from the material of the organic light-emitting layer 6.

For the gate insulation film 3, an insulating material can be used such as an organic oxide film or an inorganic oxide film as typified by $SiO_2$ and $Si_3N_4$. An inorganic oxide film with a high dielectric constant in particular is preferable. Inorganic oxides include silicon oxide, aluminum oxide, tantalum oxide, titanium oxide, tin oxide, vanadium oxide, barium-strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, and yttrium trioxide or the like. Among these inorganic oxides, silicon oxide, aluminum oxide, tantalum oxide, and titanium oxide are preferable. Inorganic nitrides such as silicon nitride and aluminum nitride can also be preferably used. Furthermore, organic compound films such as polyimides, polyamides, polyesters, polyacrylates, and optical radical polymerization systems, optically curable resins of optical cation polymerization systems, or copolymers that include an acrylonitryl component, polyvinylphenol, polyvinyl alcohol, novolac resin, and cyanoethylpullulan, a polymer body, phosphazene comprising an elastomer body, and so forth, can also be used.

For the semiconductor layer 5 of a semiconductor material, an organic semiconductor material or inorganic oxide semiconductor material can be used. As for the organic semiconductor material, a porphyrin derivative as typified by copper phthalocyanine (CuPc), a polyacene as typified by petacene, an oligothiophene as typified by α-4T, a fullerene as typified by C60, or an arylamine polymer known as starburst amine as typified by m-TDATA is often used in a low molecular system. Further, in a high molecular system for the semiconductor layer 5, a polymer material such as a polythiophene (e.g., poly (3-hexylthiophene) (P3HT)), a poly-silane, a polyacetylene can be used. For the inorganic oxide semiconductor material of the semiconductor layer 5, there are preferably used oxides including as a main component of any one of aluminum, zinc, indium, tin, gallium, titanium, tungsten, vanadium or the like. It is preferable for one of the gate insulation film 3 and the semiconductor layer 5 alternatively both thereof to be selected from the materials having a transmissivity higher than 10% or more in the wavelength of emission from the material of the organic light-emitting layer 6.

The organic light-emitting layer 6 is made to contain a fluorescent material or phosphorescent material which is a compound with a light-emitting function. An example of fluorescent material is tris(8-quinolinolato) aluminum (Alq3). It is preferable that a phosphorescent material is included in the organic light-emitting layer 6 to improve the emission efficiency thereof. The fluorescent materials include at least one type selected from the compounds disclosed in Japanese Patent Application Laid Open No. 63-264692, for example, such as, for example, compounds such as quinacridone, rubrene, and styrene-based dye. Phosphorescent materials include the organic iridium complexes and organic platina complexes in Appl. Phys. Lett., Volume 75, Page 4, 1999.

<Display Device>

A plurality of organic light-emitting transistors can also be used for the pixels of emission sites in the display device. More specifically, if there is at least one switching element and the required elements such as capacitors, as well as pixel electrodes are manufactured on a common substrate, the active drive-type display device of the present invention can be implemented.

Figure 12:
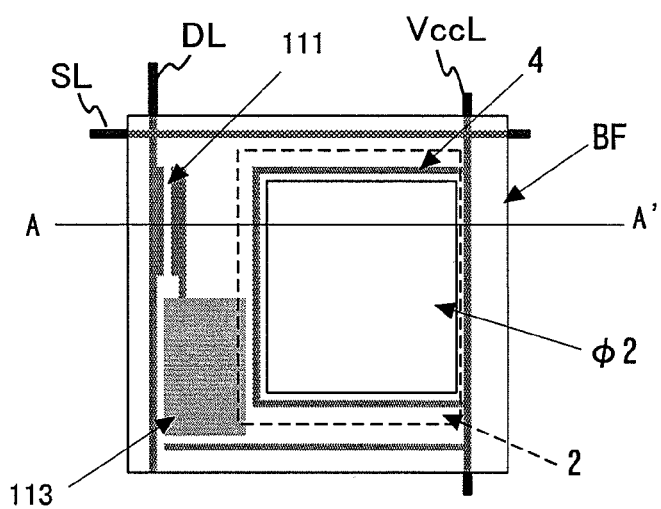
FIG. 12 is an enlarged partial plan view showing a subpixel light emission section in a display device of another embodiment according to the present invention, as seen from the substrate side thereof.
Figure 1:
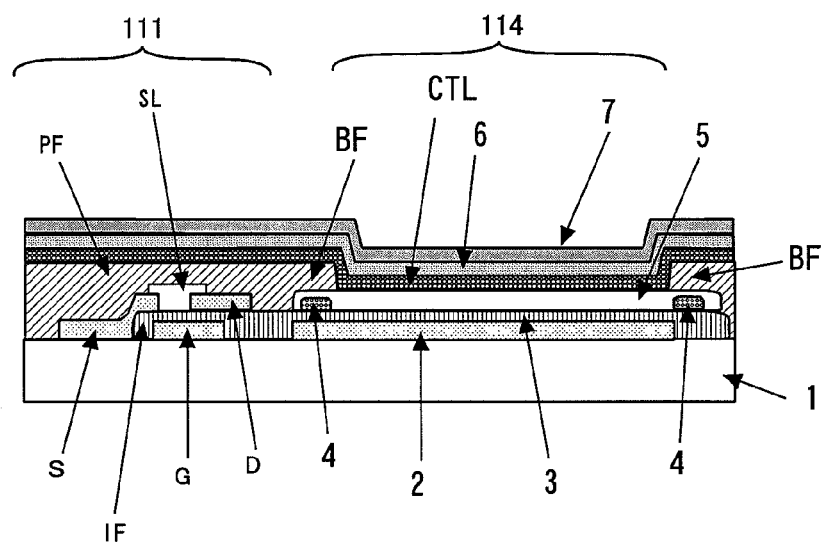
Figure 1:
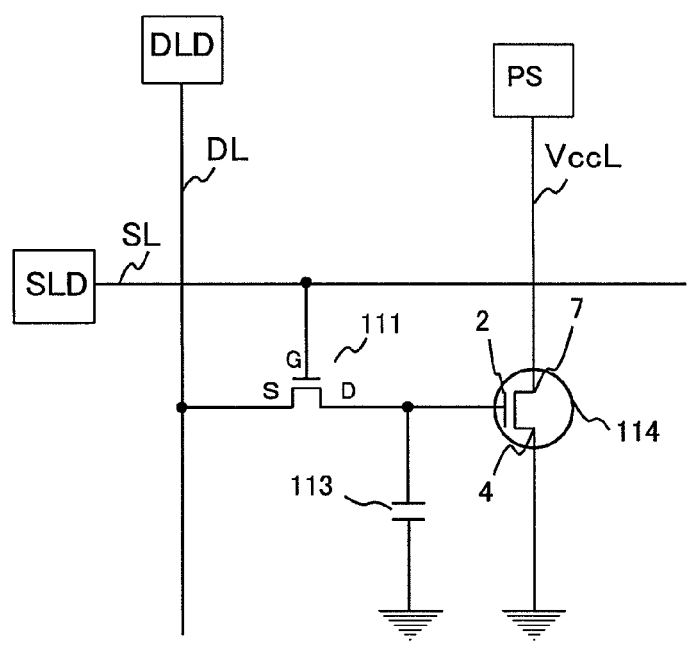

FIG. 12 is an enlarged partial plan view, seen from the substrate side thereof, showing a subpixel of a light emission section in an organic EL display panel having a plurality of pixels disposed in a matrix shape on the panel section, each subpixel being the organic light-emitting transistor 114 shown in FIG. 2. It should be noted that the organic light-emitting layer and drain electrode layer are not illustrated in FIG. 12 because the whole surface is covered with those layers in order. FIG. 13 shows a cross-sectional view taken along the line AA' of FIG. 12. FIG. 14 shows an equivalence circuit diagram of the light emission section shown in FIG. 12.

Each of the light-emitting sections formed on the substrate is constituted by a selective transistor switching element 111, a capacitor 113 holding a data voltage, and an organic light-emitting transistor 114 as shown in FIGS. 12-14. The light-emitting section of the pixel can be implemented by arranging the constitution in the vicinity of the respective intersections between the scan lines SL, supply line VccL, and signal line DL.

The gate electrode G of the switching element 111 are connected to scan line SL that supplies an address signal. And the source electrode S of the switching element 111 is connected to the signal line DL. The drain electrode D of the first switching element 111 is connected both to the gate electrode layer 2 of the organic light-emitting transistor 114 and one terminal of the capacitor 113.

The drain electrode layer 7 of the organic light-emitting transistor 114 is connected to the supply line VccL and the source electrode layer 4 of the organic light-emitting transistor 114 is grounded.

Each of the scanning lines SL is connected to a scanning line driver SLD. The signal line DL is connected to a data line driver DLD. And the supply line VccL is connected to a power supply PS.

Such a power supply PS is the first voltage applying means for applying a constant voltage between the source electrode layer and the drain electrode layer. The scanning line driver SLD and the data line driver DLD are the second voltage applying means for applying a variable voltage between the source electrode layer and the gate electrode layer.

In case that a display device using the organic light-emitting transistor 114 is fabricated, as shown in FIG. 13, since the switching element 111 such as at least one field effect transistor is required, a protecting film PF can be formed at the same time with the formation of the charge-carrier suppression layer BF in order that the switching element is not affected by influence of moisture, activated gas or the like. In addition, the gate electrode G of the switching element 111 and the gate electrode layer 2 of the organic light-emitting transistor 114 can be formed at the same time. Further, the insulation film IF of the switching element 111 and the gate insulation film 3 of the organic light-emitting transistor 114 can be formed at the same time. Therefore, the switching element 111 may have an insulation film IF made of the same material as that of the gate insulation film 3, or the charge-carrier suppression layer BF in the organic light-emitting transistor 114 as well as the switching element 111 may have a semiconductor layer SL made of the same material as that of the semiconductor layer 5 in the organic light-emitting transistor 114.

Embodiment 1

Figure 16:
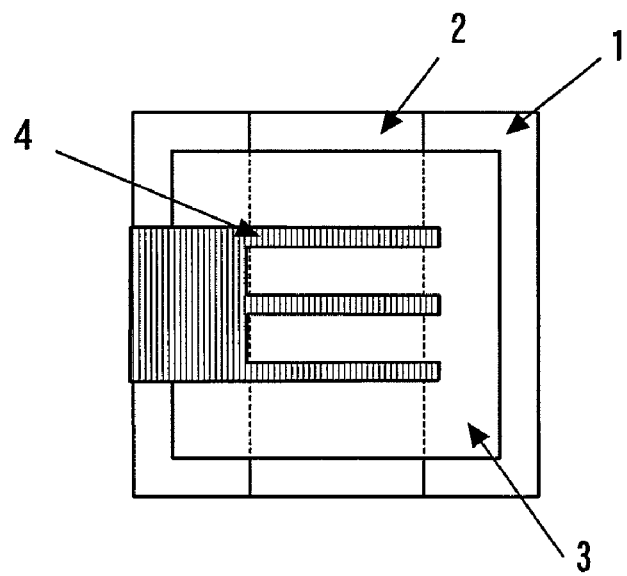
Figure 17:
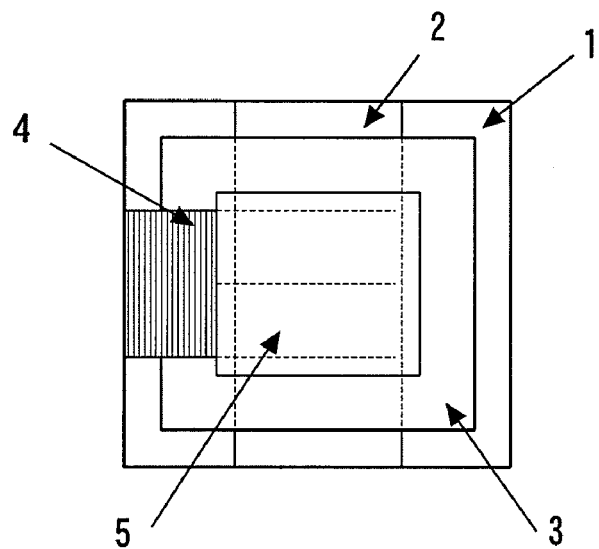

A light-emitting transistor of an embodiment that uses an organic insulation film as a charge-carrier suppression layer was fabricated. Each of FIGS. 15-20 is a plan view seen from the substrate side of the second organic light-emitting transistor during the fabrication step. As shown in FIG. 16, the source electrode layers 4 are formed with a comb shape or blind shape. In addition the source electrode layers 4 may have a grating shape and, if the anodes have a grating shape, comb shape or blind shape, an area of surface (interface) for supplying the charge-carriers to the organic semiconductor layer is increased. As shown in FIG. 17, the charge-carrier suppression layer BF is formed to cover the source electrode layer 4 through the semiconductor layer 5 and, an area of the charge-carrier suppression layer BF occupying in the organic light-emitting transistor is equal to or larger than that of the source electrode layer 4. Therefore an aperture pattern can be defined to cause charge-carriers to pass through the semiconductor layer 5.

A light-emitting transistor of this kind was fabricated using steps (1) to (7).

Figure 15:
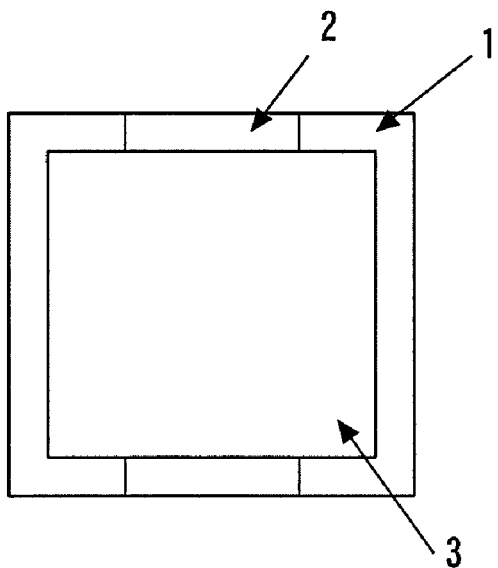
FIGS. 15-20 are partial plan views each showing a substrate in a fabricating process for an organic light-emitting transistor of an embodiment according to the present invention.

Step (1)—As shown in FIG. 15, a gate insulation film 3 of SiO$_2$ was deposited at a 300 nm thick on a 100 nm thick ITO film as a gate electrode layer 2 formed on Corning Incorporated™ glass substrate 1 by sputtering.

Step (2)—As shown in FIG. 16, on the gate insulation film 3 a gold (Au) film was deposited at a 30 nm thick for a source electrode layer 4 by sputtering and then a photolithography mask with a desire pattern was formed thereon and then the exposure and development were conducted to obtain a photoresist pattern and then the gold (Au) film was etched using a gold (Au) exclusive etching liquid (KANTO CHEMICAL CO., INC.:AURUM-302) and then the resist film was removed using an exclusive resist-exfoliating liquid.

Step (3)—As shown in FIG. 17, petacene for a semiconductor layer 5 was deposited on the gate insulation film 3 and the source electrode layer 4 with a thickness of 50 nm at 0.01 nm/s of vacuum deposition rate under a vacuum of $10^{-5}$ Pa.

Figure 18:
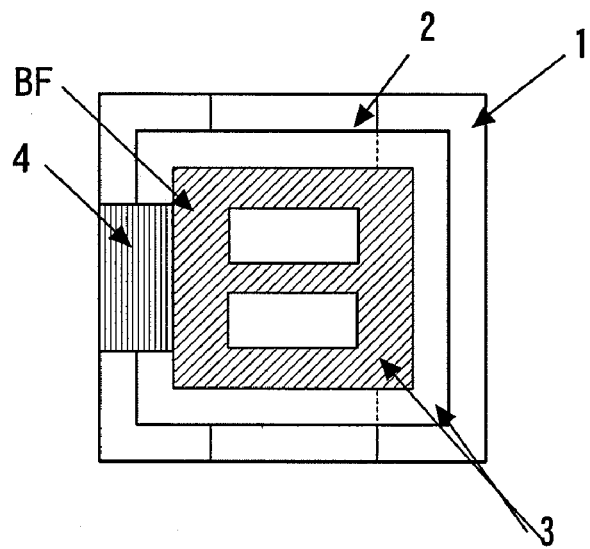
Figure 19:
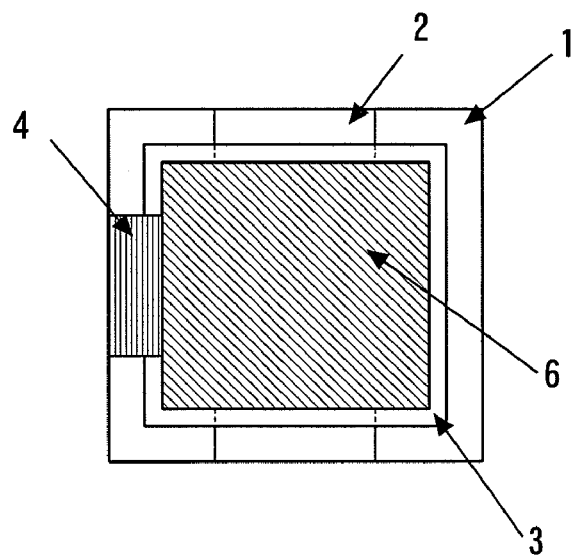

Step (4)—A photosensitive polyvinyl alcohol martial for a charge-carrier suppression layer BF was deposited on the gate insulation film 3 and the semiconductor layer 5 with a homogeneous thickness of 500 nm by spin-coating method. After that, it was exposed using a photo-mask and then developed with water to appear a desired pattern as shown in FIG. 18.

Step (5)—After that, a-NPD for a carrier transport layer was deposited on the gate insulation film 3 and charge-carrier suppression layer BF with a thickness of 50 nm at 0.2 nm/s of vacuum deposition rate under a vacuum of $10^{-5}$ Pa by using a shadow mask. And then Alq3 for an organic light-emitting layer 6 was deposited on the carrier transport layer with a thickness of 60 nm at 0.2 nm/s similarly by means of vacuum deposition.

Figure 20:
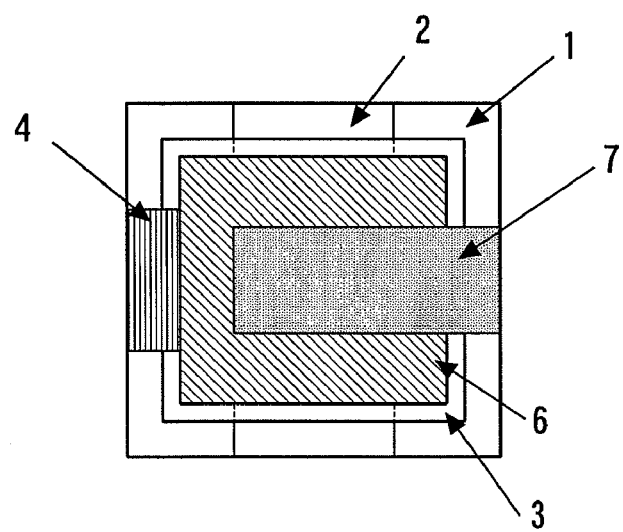

Step (6)—After that, as shown in FIG. 20, a lithium fluoride (LiF) film was deposited at a 1 nm thick on the gate insulation film 3 and the organic light-emitting layer 6 as a carrier injection layer and then an aluminum (Al) film as a drain electrode layer 7 was deposited at a 100 nm thick over the substrate using a shadow mask which is different from the preceding one.

<Evaluation with Comparatives>

Figure 21:
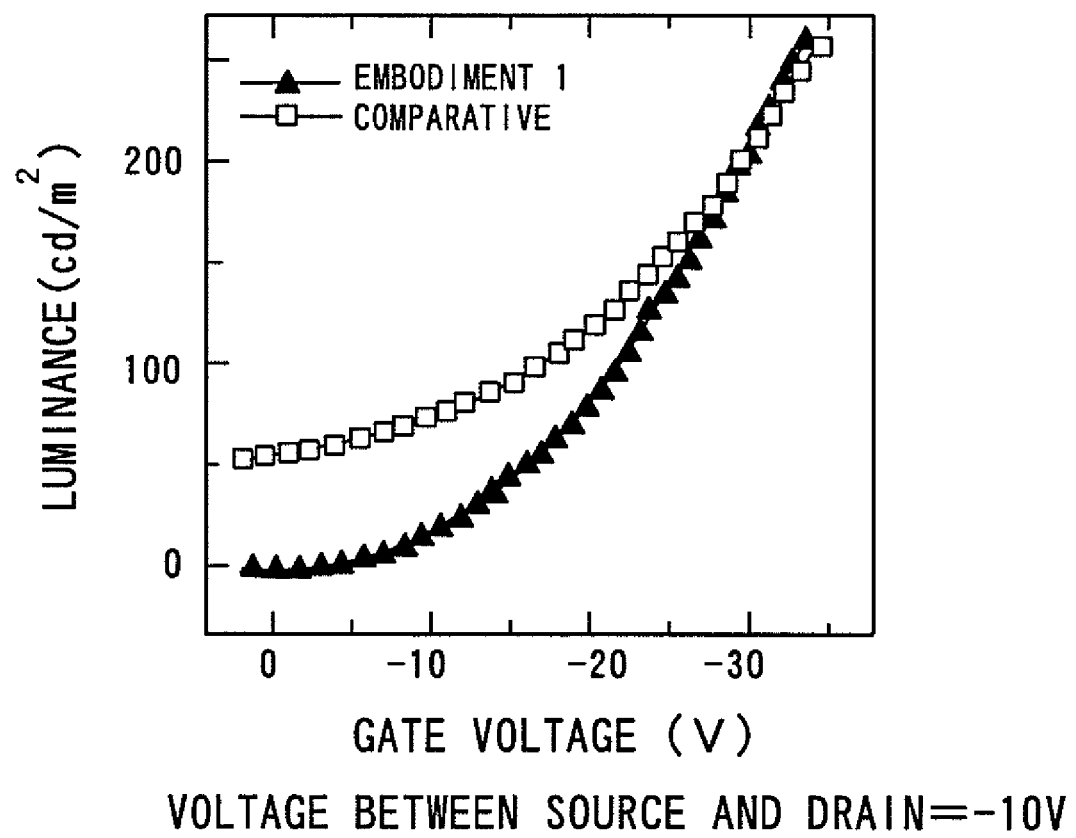
FIG. 21 is a graph showing properties of gate voltage versus luminance of an embodiment according to the present invention and comparative one.

To compare with devices, comparatives of the organic light-emitting transistors were fabricated through the foregoing Step (1)-(6), except that the charge-carrier suppression layer BF was omitted in the foregoing Step (4). FIG. 21 shows a graph showing properties of gate voltage versus luminance of Embodiment 1 and the comparative one.

Embodiment 1 had the organic film (petacene) as a semiconductor layer. Generally, an organic film formed by vacuum deposition is very weak against moisture, an organic solvent or the like and, it is very difficult to form other organic films like the Embodiment 1 on the organic film by a coating method. In contrast, the charge-carrier suppression layer BF was formed using a water-soluble resist in view that petacene is comparatively tough to moisture. As a result, it was possible to realize a device having a low OFF electric current without deteriorated property.

In addition, a suitable carrier transport layer or carrier injection layer may be inserted to realize to lower the emission starting voltage and to improve the emission efficiency. For such purpose, Embodiment 1 had the carrier transport layer of a-NPD and the carrier injection layer of LiF.

Embodiment 2

Step (1)—a gate insulation film 3 of SiO$_2$ was deposited at a 300 nm thick on a 100 nm thick ITO film as a gate electrode layer 2 formed on Corning Incorporated™ glass substrate 1 by sputtering as well as Embodiment 1.

Step (2)—chromium film was deposited as a source electrode layer 4 by vacuum deposition and a wet-etching was conducted to form the same pattern as that of Embodiment 1 in Step (2). The used exclusive chromium-etching liquid was available from KANTO CHEMICAL CO., INC.

Step (3)—zinc oxide (ZnO) for a semiconductor layer 5 was deposited with a thickness of 50 nm by sputtering and then a desired resist pattern was formed using a photo-mask and then the unnecessary ZnO film portion was removed by dry-etching. After that, the resist film was removed using an exclusive resist-exfoliating liquid.

Step (4)—A novolac resin resist (TOKYO OHKA KOGYO CO., LTD:TFR-1250) for a charge-carrier suppression layer BF was deposited in similar manner to Embodiment 1 in Step (4).

Step (5)—tris(8-quinolinolato) aluminum (Alq3) and coumarin (C545T) were co-deposited as a organic light-emitting layer 6 with a thickness of 40 nm by vacuum deposition under a vacuum of $10^{-5}$ Pa. At this time the density of coumarin was 3 wt %. And then, a-NPD for a carrier transport layer was deposited with a thickness of 50 nm. After that, copper phthalocyanine (CuPc) for a carrier injection layer was deposited with a thickness of 30 nm. Further, the formed areas were defined using the same shadow mask in the processes for depositing the organic light-emitting layer, carrier transport layer, and carrier injection layer.

Step (6)—gold (Au) was deposited as a drain electrode layer 7 with a thickness of 50 nm by vacuum deposition using another shadow mask differing from Step (5).

The invention claimed is:

1. An organic light-emitting transistor having a source electrode layer; a drain electrode layer facing said source electrode layer; an organic light-emitting layer formed between said source electrode layer and said drain electrode layer; a semiconductor layer formed between said organic light-emitting layer and said source electrode layer; and a gate electrode layer deposited to face through a gate insulation film to one face of said source electrode layer opposite to the other face facing said drain electrode layer, said organic light-emitting transistor further comprising:
    a charge-carrier suppression layer formed between said organic light-emitting layer and said source electrode layer to have an aperture; and
    a relay region formed between said charge-carrier suppression layer and said source electrode layer to relay charge-carriers from said source electrode layer to said aperture.

2. The organic light-emitting transistor according to claim 1, wherein said source electrode layer has an aperture and wherein a portion of said charge-carrier suppression layer defining said aperture is formed to cover an edge defining said aperture of said source electrode layer.

3. The organic light-emitting transistor according to claim 1, wherein said aperture of said charge-carrier suppression layer is formed to confine a flow of charge-carriers supplied from said source electrode layer.

4. The organic light-emitting transistor according to claim 1, wherein an area of said charge-carrier suppression layer occupying in said organic light-emitting transistor is equal to or larger than that of said source electrode layer.

5. The organic light-emitting transistor according to claim 1, wherein said charge-carrier suppression layer is made of an insulating material or of a semiconductor material having a reversed polarity against said semiconductor layer.

6. The organic light-emitting transistor according to claim 1, wherein said charge-carrier suppression layer has a thickness equal to or thicker than that of said source electrode layer.

7. The organic light-emitting transistor according to claim 1, wherein said semiconductor layer is made of an organic semiconductor material or inorganic oxide semiconductor material.

8. The organic light-emitting transistor according to claim 1, further comprising at least one carrier transport layer deposited between said semiconductor layer and said organic light-emitting layer.

9. The organic light-emitting transistor according to claim 1, further comprising a carrier injection layer or at least one carrier transport layer or both thereof deposited between said drain electrode layer and said organic light-emitting layer.

10. The organic light-emitting transistor according to claim 1, further comprising an additional insulation film made of an insulating material covering said charge-carrier suppression layer only at a side of said source electrode layer.

11. The organic light-emitting transistor according to claim 1, wherein said semiconductor layer is made of a p-type semiconductor material or n-type semiconductor material.

12. The organic light-emitting transistor according to claim 1, wherein said gate electrode layer or drain electrode layer or both thereof is made of a material having a transmissivity higher than 10% or more in the wavelength of emission from the material of said organic light-emitting layer.

13. A display device in which a plurality of light-emitting sections are disposed in a matrix shape, each light-emitting section being said organic light-emitting transistor according to claim 1, the display device comprising at least one switching element electrically connected to said gate electrode layer per said organic light-emitting transistor.

14. The display device according to claim 13, further comprises a wiring that supplies electrical power to said source electrode layer or said drain electrode layer of said organic light-emitting transistor and a wiring for applying ON/OFF voltage information to said gate electrode layer.

15. The display device according to claim 13, further comprises a first voltage applying means for applying a constant voltage between said source electrode layer and said drain electrode layer and a second voltage applying means for applying a variable voltage between said source electrode layer and said gate electrode layer.

16. The display device according to claim 13, wherein said switching element has an insulation film made of the same material as that of said gate insulation film.

17. The display device according to claim 16, wherein said insulation film of said the switching element and said gate insulation film are fabricated simultaneously.

18. The display device according to claim 13, wherein said switching element has an insulation film made of the same material as that of said charge-carrier suppression layer.

19. The display device according to claim 18, wherein said insulation film of said the switching element and said charge-carrier suppression layer are fabricated simultaneously.

20. The display device according to claim 13, wherein said switching element has a semiconductor layer made of the same material as that of said semiconductor layer of said organic light-emitting transistor.

21. The display device according to claim 20, wherein said semiconductor layer of said the switching element and said semiconductor layer of said organic light-emitting transistor are fabricated simultaneously.

* * * * *